United States Patent [19]

Patadia et al.

[11] Patent Number: 6,146,504

[45] Date of Patent: Nov. 14, 2000

[54] SUBSTRATE SUPPORT AND LIFT APPARATUS AND METHOD

[75] Inventors: Nalin Patadia, Campbell; Charles Carlson, San Jose, both of Calif.

[73] Assignee: Applied Materials, Inc., Santa Clara, Calif.

[21] Appl. No.: 09/084,200

[22] Filed: May 21, 1998

[51] Int. Cl.[7] .................................................. C23C 14/34
[52] U.S. Cl. .............................. 204/192.12; 204/248.15; 156/345; 118/728
[58] Field of Search ....................... 204/192.12, 298.15; 118/728; 156/345, 345 PW, 345 WH; 427/569

[56] References Cited

U.S. PATENT DOCUMENTS

| | | | |
|---|---|---|---|
| 5,352,294 | 10/1994 | White et al. ............................ | 118/725 |
| 5,494,523 | 2/1996 | Steger et al. ......................... | 118/723 E |
| 5,516,367 | 5/1996 | Lei et al. .................................. | 118/725 |
| 5,632,873 | 5/1997 | Stevens et al. ...................... | 204/298.15 |
| 5,645,646 | 7/1997 | Beinglass et al. ...................... | 118/730 |
| 5,904,779 | 5/1999 | Dhindsa et al. ..................... | 118/723 E |
| 5,935,338 | 8/1999 | Lei et al. .................................. | 118/725 |
| 5,935,397 | 8/1999 | Masterson .......................... | 204/298.12 |

FOREIGN PATENT DOCUMENTS 0 777 264 A1  6/1997  European Pat. Off. ........ H01L 21/00

OTHER PUBLICATIONS

PCT International Search Report dated Sep. 16, 1999.

*Primary Examiner*—Nam Nguyen
*Assistant Examiner*—Steven H. Ver Steeg
*Attorney, Agent, or Firm*—Thomason, Moser and Patterson

[57] ABSTRACT

The present invention provides optimized designs that allow the coverage of the full surface of a receiving face in a substrate while at the same time reducing material deposition on the edge of the substrate, material deposition on and/or scratching of the backside of the substrate. While the methods and apparatus of the invention are described within the framework of aluminum deposition chambers, it is contemplated that the invention will be equally effective in all other semiconductor processing chambers where avoiding edge and/or backside deposition, scratching, and/or sticking may be desirable. The invention provides a support member having a deposit collection channel with slanted walls to trap deposit particles that do not depose of the substrate thus preventing deposition and sticking in the backside of a processed substrate. The invention also provides a resting and lifting mechanism to minimize friction between the backside of the substrate and the support member thus reducing contamination of the chamber environment by particles released due to scratching of the backside of the substrate.

33 Claims, 10 Drawing Sheets

SUBSTRATE SUPPORT AND LIFT APPARATUS AND METHOD

BACKGROUND OF THE INVENTION

1. Field of the Invention

The present invention relates to semiconductor substrate processing equipment. More particularly, the present invention relates to a method and apparatus for reducing undesirable deposition of material on the backside of the substrate during processing. Still further, the invention relates to method and apparatus for supporting a substrate in a processing chamber.

2. Background of the Related Art

The fabrication of semiconductor devices on substrates, including semiconductor substrates, typically requires the deposition of multiple metal, dielectric and semiconductor films on the surface of the substrate. The films are typically deposited on the substrates in vacuum chambers. One deposition technique is physical vapor deposition (PVD) typically referred to as sputtering, wherein a target comprised of the deposition material is exposed to a plasma and atoms or larger particles of target material are sputtered from the target and are deposited on the substrate.

To form the deposition layer on the substrate, a deposition environment must be created within the chamber adjacent to the deposition receiving surface of the substrate. In a physical vapor deposition system, the deposition environment includes a plasma maintained between the target and the substrate and a flux of sputtered target particles passes between the target and the deposition receiving surface of the substrate so that a portion of the sputtered target particles deposit on the substrate to create the deposition layer.

Figure 1:
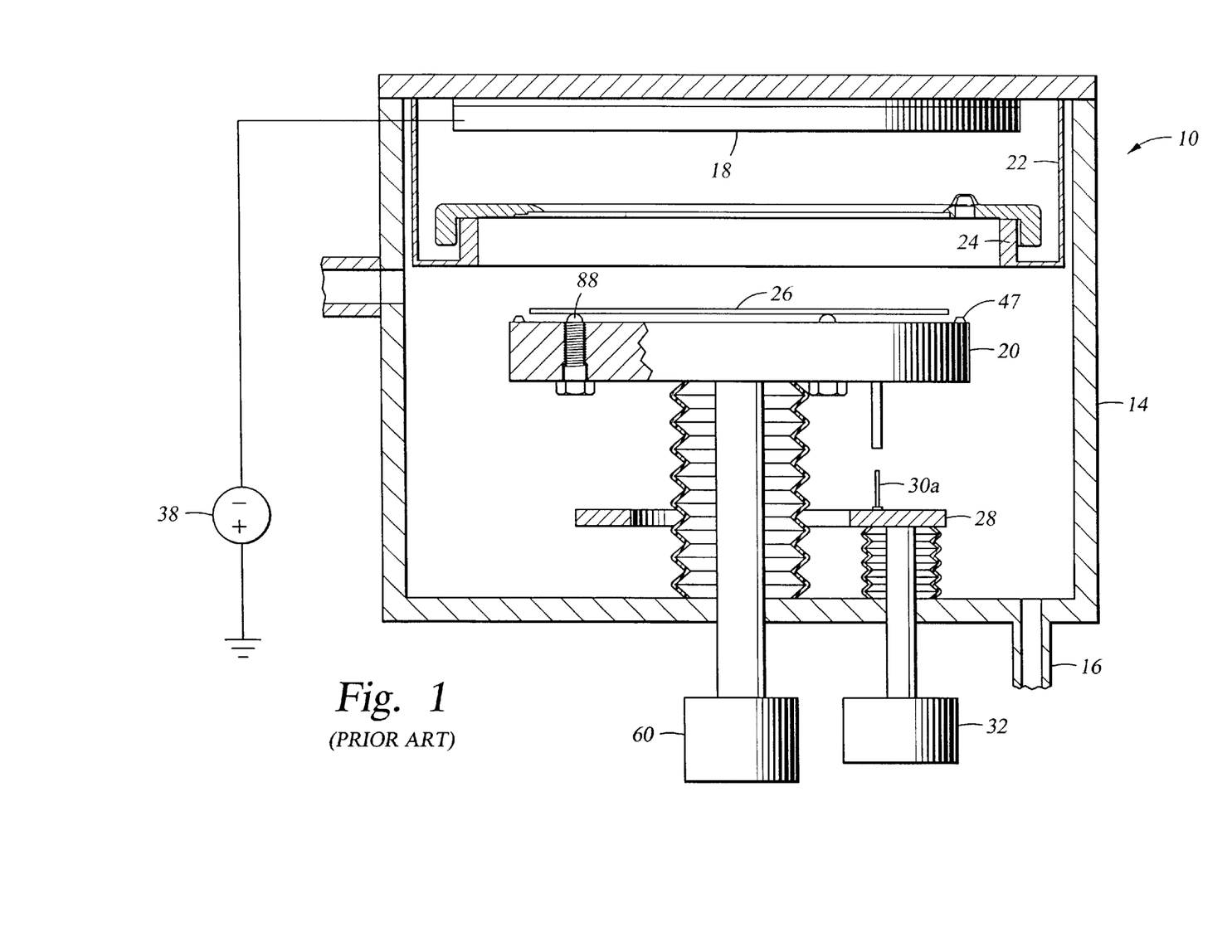
FIG. 1 is a simplified sectional view of a conventional physical vapor deposition chamber having a substrate support member and a lift pin assembly disposed therein.

FIG. 1 is a simplified sectional view of a conventional PVD chamber 10 which generally includes a chamber enclosure wall 14 having at least one gas inlet (not shown) and an exhaust outlet 16 connected to an exhaust pump (not shown). A substrate support member 20 is disposed at the lower end of the chamber 10 and a target 18 is received at the upper end of the chamber 10. In addition to providing a resting and lifting mechanism, the support member is also used to dissipate the heat generated during deposition. The target 18 is electrically isolated from the enclosure wall 14 and the enclosure wall 14 is preferably grounded so that a negative voltage may be maintained on the target 18 with respect to the grounded enclosure wall 14. A shield 22 is suspended from the chamber cover and includes an annular, upturned, wall 24 which isolates the lower portion of the chamber when the substrate support member is in a raised position for processing A conventional robot arm carries a substrate 26 into the chamber 10 and positions the substrate 26 above the upper tips of the pins 30a. A lift mechanism 32 elevates platform 28 which lifts the pins 30a upwardly to lift the substrate 26 off the robot blade. The robot blade then retracts from the chamber 10, and a substrate support lift mechanism 60 raises the support member 20 and the lift pins are lowered to place the substrate 26 on a resting mechanism coupled to the support member.

The resting mechanisms generally provided in conventional processing chambers are prone to producing contaminants by scratching the backside of the substrate. During the deposition process, the substrate is disposed on one or more rest pins 88. The rest pin 88 is rigidly fastened to the support member 20. Thus, vibrations in the support member are communicated to the support pins which results in friction between the support pins and the backside of the substrate. Friction between the support pins and the substrate may lead to deep scratches in the backside of the substrate, thus releasing substrate material which contaminates the environment within the chamber.

In physical vapor deposition systems, the deposition material will, if left unconfined, deposit on all of the interior surfaces of the chamber. Typically, material is sputtered in a cosine pattern. In particular, material which does not deposit on the material receiving surface of a substrate may deposit on the edge or backside of the substrate. Edge and/or backside deposition may lead to damage of the substrate and adhesion or sticking of the substrate to components of the processing chamber. In particular, backside deposition may lead to the formation of bridging layers between the backside and the support member in the chamber leading to adhesion of the substrate to the support member. Adhesion of the substrate to the support member is generally referred to as sticking.

In conventional chambers used for full coverage deposition on substrates, a large gap must be maintained between the support member and the substrate to delay the formation of a bridging layer between the substrate and the support member due to the accumulation of material in the space between the backside of the substrate and the support member. However, maintaining a large gap between the support member and the substrate may drastically reduce the efficiency of heat dissipation by the support member.

In spite of the space maintained between the support member and the substrate, deposition in the area of contact between the resting and lifting mechanism and the substrate generally results in accumulation of material capable of adhering to the substrate and the support member, thus necessitating operator intervention to separate the substrate from the resting mechanism which leads to substantial down time of the chamber.

One avenue for reducing edge and backside deposition and the related adhesion and contamination problems is provided by forming a rectangular channel in the periphery of the support member. Material which deposits at the perimeter of the substrate is collected in the channel and prevented from accumulating at the edge of the substrate and ultimately forming a bridging layer between the support member and the backside of the substrate.

Figure 2:
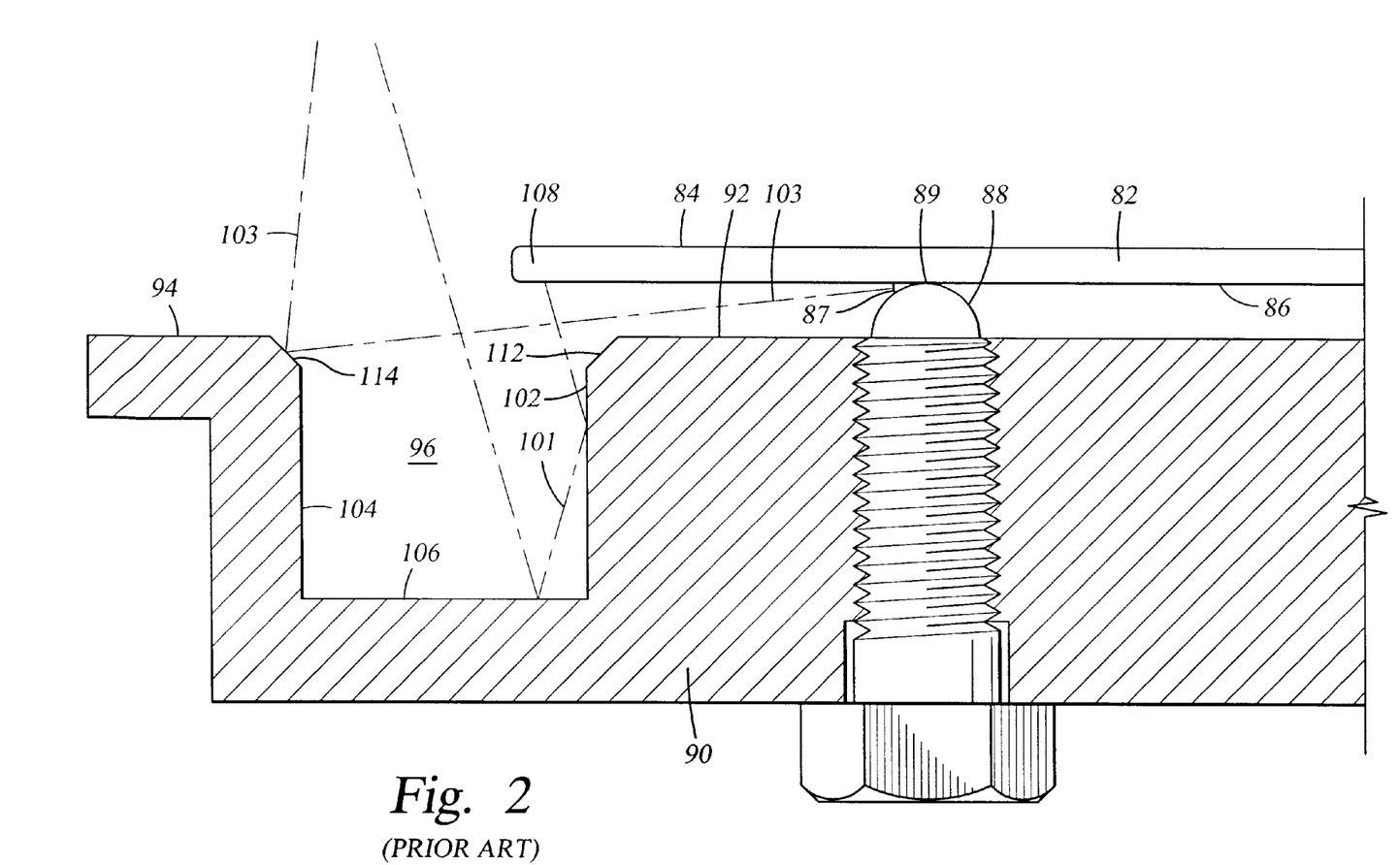
FIG. 2 is a partial sectional view of a prior support member having a perimeter rectangular channel for material collection and a substrate support pin.

FIG. 2 is a partial sectional view of a substrate support member having a rectangular collection channel 96 for material collection and a substrate support pin 88 disposed in the support member to support the substrate 82. The upper surface 84 of the substrate 82 is exposed to a target (not shown) and the backside 86 of the substrate contacts support pin 88. The support member 90 has a substrate receiving region 92 and a peripheral region 94 comprising a collection channel 96 disposed therein. The collection channel 96 is formed by sidewalls 102, 104 and a base 106. The edge 108 of the substrate 82 extends beyond the substrate receiving region 92 and over hangs the collection channel 96 when supported in the chamber. During processing, material deposits on the entire surface of the material receiving face and in the collection channel 96. As the deposition material impacts the walls of the collection channel 96, the material may lose kinetic energy during the impact and accumulate in the collection channel 96. The top end of each wall 102, 104 may be machined to include chamfers 112, 114 that may contact particles from the depositing material and divert their trajectories to avoid contact between the material and the backside 86 of the substrate 82.

Although the design of FIG. 2 may allow material deposition over the full surface of the material receiving face 84 while accumulating in the collection channel 96, the design may only marginally decrease backside deposition. After impacting the walls 102, 104 and/or the base 106, only particles with low kinetic energy will likely remain within the collection channel 96 while other particles contacting the walls and the base of the channel will have enough kinetic energy to continue their trajectory, have a number of impacts with the walls and the base of the channel, and possibly continue on a trajectory 101 which guides them to the backside 86 of the substrate. While the chamfers 112, 114 may deflect some of the particles away from the backside of the substrate, other particles may impact the chamfers at angles that would actually direct their trajectories 103 towards the backside of the substrate, and some particles may even end up near the contact region 89 between the support pin 88 and the substrate resulting in adhesion of the substrate to the support pin. The deposition of particles near the contact region 89 and the deposition of material bridging the backside of the substrate and the support pin are enhanced when the outer surface of the support pin has a steep slope to form a large gap 87 between the top portion of the support pin 88 and the backside of the substrate near the contact region 89.

Another problem encountered with the support pins 88 is backside scratching of the substrate. The support pins 88 are rigidly fixed to the support member 90 thereby translating the vibrations of the system to the backside of the substrate near the region 89. Increased relative movement between the support pins 88 and the substrate increases the likelihood that scratching on the backside of the substrate occurs thereby increasing the potential for contamination in the chamber. Furthermore, the problems relating to the friction between the substrate and the equipment are generally complicated when the deposit material reaches the backside of the substrate, particularly near the area of contact between the resting mechanism and the backside of the substrate.

The limited reduction in backside deposition and substrate sticking provided by the design of FIG. 2 requires maintaining a gap of at least 40 mils between the substrate and the support member to delay the formation of a bridging layer between the substrate and the support member. Typically, maintaining a large gap between the substrate and the support member is achieved by reducing the thickness of the support member, thus reducing the capacity of the support member to dissipate the heat generated during substrate processing.

Therefore, there is a need for a method and apparatus that would allow full coverage substrate processing and efficient heat dissipation during substrate processing while reducing material deposition on the backside of the substrate by trapping a substantial fraction of the deposition material in a collection channel. Additionally, there is a need for methods and apparatus which reduce or eliminate substrate scratching and the contamination which results therefrom.

SUMMARY OF THE INVENTION

The present invention generally provides methods and apparatus for improving substrate processing in a chamber. Particularly, the methods and apparatus of the invention enable full coverage deposition on a substrate while minimizing processing and servicing problems associated with backside deposition and contamination in the chamber due to backside substrate scratching.

In one aspect, the invention provides support pins loosely coupled to a support member in a processing chamber to dissipate vibrations that may occur in the support member, thereby reducing scratching on the backside of the substrate. Each support pin is movably housed in a recess formed in the upper portion of the support member. The support pins include an upper arcuate portion having a large radius to minimize the space between the outer slope of the support pin and the backside of the substrate. The dimensions of the recess in the upper portion of the support member are adjusted to allow lateral movement of the support pin within the recess.

In another aspect, the invention further comprises lift pins slidably coupled to the support member. Each lift pin is coupled to a support pin through a recess in the lower portion of the support member. The lift pin passes through the recess in the lower portion of the support member and engages a recess formed in a support pin. The dimensions of the recess in the lower portion of the support member may be adjusted to allow the support pin to remain housed in a recess in the support member when the lift pin retracts from the recess in the support pin. The dimensions of the recess in the lower portion of the support member may also be adjusted to allow the support pin and the lift pin to remain coupled and concurrently retract from the support member.

In one embodiment, the support member comprises three support pins positioned in three equally spaced recesses formed in the support member. The support member also comprises three lift pins, each lift pin slidably coupled to one support pin through a recess in the bottom portion of the support member.

In still another aspect, the invention provides a semiconductor substrate deposition chamber comprising an enclosure; a support member positioned within the enclosure for supporting a substrate in the chamber, the support member having a substrate receiving region and a peripheral region along the perimeter of the substrate receiving region, and a deposition collection channel formed in the peripheral region to trap deposition material and prevent formation of a bridging layer between the support member and a substrate. Preferably, the collection channel is a quadrilateral collection channel having a mouth smaller than the base wherein the mouth has rounded corners to deflect particles away from the backside of the substrate.

In still another aspect, the invention provides a support member comprising a dam positioned between the substrate support pins and the edge of the substrate receiving surface or peripheral region. The dam preferably extends upwardly from the top surface of the support member and forms a substantially continuous wall around the entire perimeter of the substrate. The position and dimensions of the dam are optimized to prevent deposition material from reaching the space between the top of the support member and/or lift pins and the backside of the substrate. Preventing particles from reaching the space separating the support member and/or lift pins and the substrate allows the use of pins having large radius, curved top portions, while at the same time preventing the deposition of material which bridges the support pins to the substrate.

The invention also encompasses a method of depositing material on a substrate in a processing chamber comprising the steps of placing the substrate on a support member in the chamber, exposing the substrate to material originating from a target in the chamber, collecting at least a fraction of the material passing by the edge of the substrate in a quadrilateral collection channel; and reducing material deposition on the back side of the substrate.

In a further aspect of the invention, a method is provided for collecting at least a fraction of the material passing by the edge of the substrate comprising providing a support member having top and bottom ends and a peripheral and a substrate receiving regions, the support member comprising a deposit collection channel formed in the peripheral region having a base formed in the bottom end of the support member and a mouth formed in the top end of the support member. Reducing material deposition on the backside of the substrate is accomplished by providing a quadrilateral collection channel having a mouth smaller than the base, a first wall adjacent the substrate receiving region; and a second wall opposite the first wall; the walls having bottom ends separated by the base of the channel and top ends forming the mouth of the channel, and slanting the walls to form opposing obtuse angles between the walls and the base of the channel. Preventing material from continuing its trajectory towards the backside of the substrate comprises rounding the top end of the walls to form a mouth having rounded corners and/or providing a collection channel with opposing convex or concave walls. Also, material is blocked from reaching the space adjacent the area of contact between the substrate and the support member by a circular dam concentric with the channel, extending upwardly from the top end of the support member. The position and the dimensions of the dam are adjusted to minimize material deposition near the contact area between the backside of the substrate and the support pins.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention provides a method and apparatus for full coverage substrate processing which reduces deposition of material on the backside of the substrate and prevents adhesion of the substrate to support member. The invention also provides techniques for supporting the substrate on a support member and lifting the substrate within the chamber while reducing contamination of the chamber environment by minimizing scratching of the substrate at the contact between the support pins, the lift pins, and/or the substrate.

While the methods and apparatus of the invention are described within the framework of physical vapor deposition chambers, it is contemplated that the invention will be equally effective in all other semiconductor processing chambers where avoiding edge deposition, backside deposition, scratching, and/or sticking may be desirable.

Resting and lifting mechanism for sticking and backside scratching reduction.

The invention provides a new resting and lifting mechanism that minimizes friction and movement between the backside of the substrate and the support pins. The support pins of the invention are loosely coupled to the support member so that the substrate and the support pins may move in concert in response to vibrations that may occur in the processing system. Allowing the substrate and the support pins to move in concert reduces the friction between the support pins and the substrate.

Figure 3:
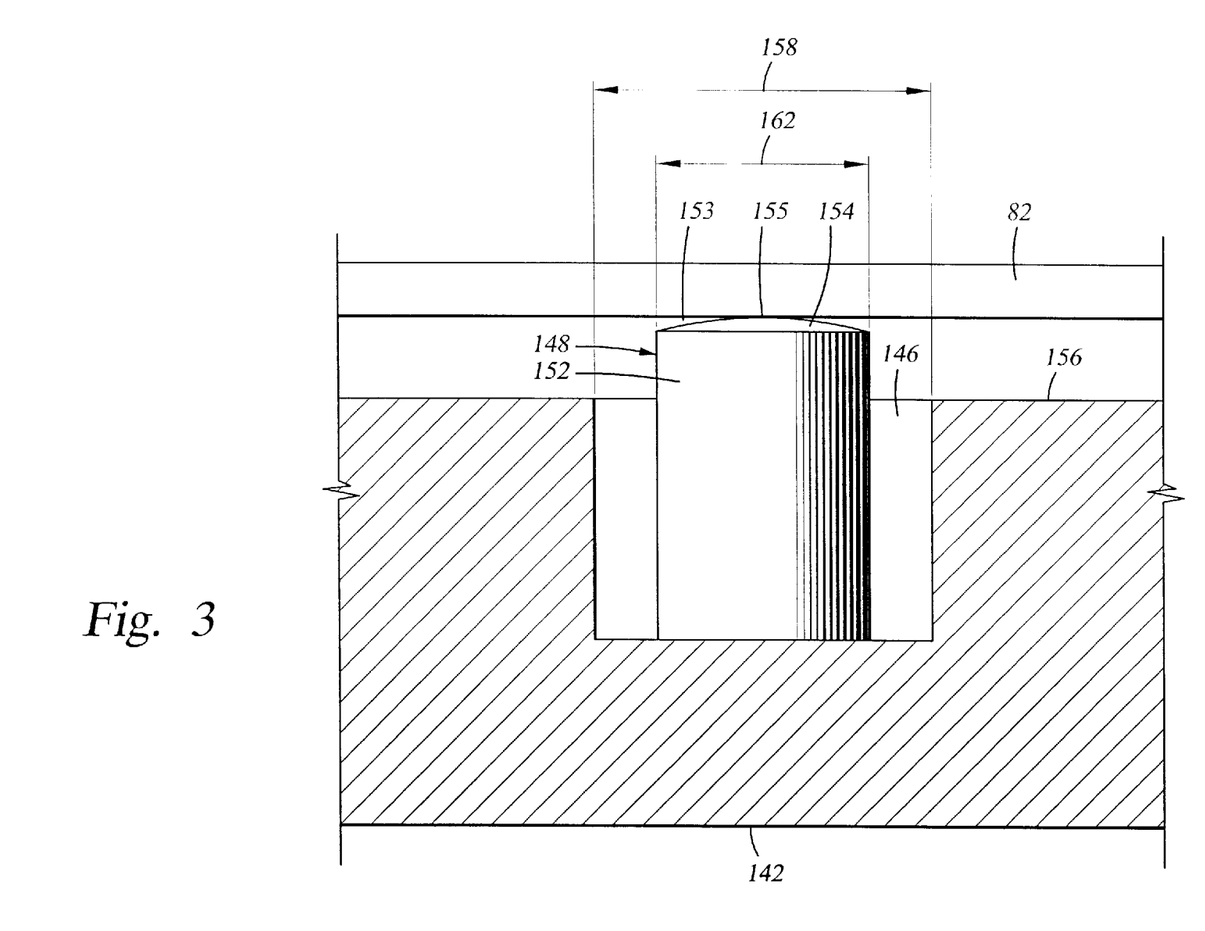
FIG. 3 is a partial sectional view of the substrate receiving region of a support member having a support pin of the invention disposed therein.

FIG. 3 is a partial sectional view of the substrate receiving region of a support member 142 showing a support pin 148 disposed in a recess 146. A support pin 148 having a body portion 152 and an arcuate, upper portion 154 is placed in the recess 146 with the arcuate portion 154 extending at least partially above the upper surface 156 of the support member. The radius of the arcuate portion 154 is optimized so that the space 153 between the backside of the substrate and the arcuate portion of the support pin is minimized while at the same time keeping to a minimum the area 155 of the backside of the substrate in contact with the support pin. The width 158 of the recess 146 is preferably at least slightly larger than the width 162 of the support pin 148 to allow lateral movement of the support pin 148 in the recess 146. Optimizing the size of the recess 146 and the support pin 148 to allow lateral movement of the support pin in the recess enables the pin to absorb the vibrations of the system thereby preventing relative movement between the support pin and the substrate. This also allows support pin 148 to slightly shift or rotate with the substrate during thermally induced movement of the substrate. This flexibility dissipates the vibrations that the support member may experience during movement and the deposition process and minimizes scratching and damage to the backside of the substrate. The support pin is preferably a stainless steel pin, electropolished or coated with a friction reducing substance to further minimize scratching of the substrate.

Figure 4:
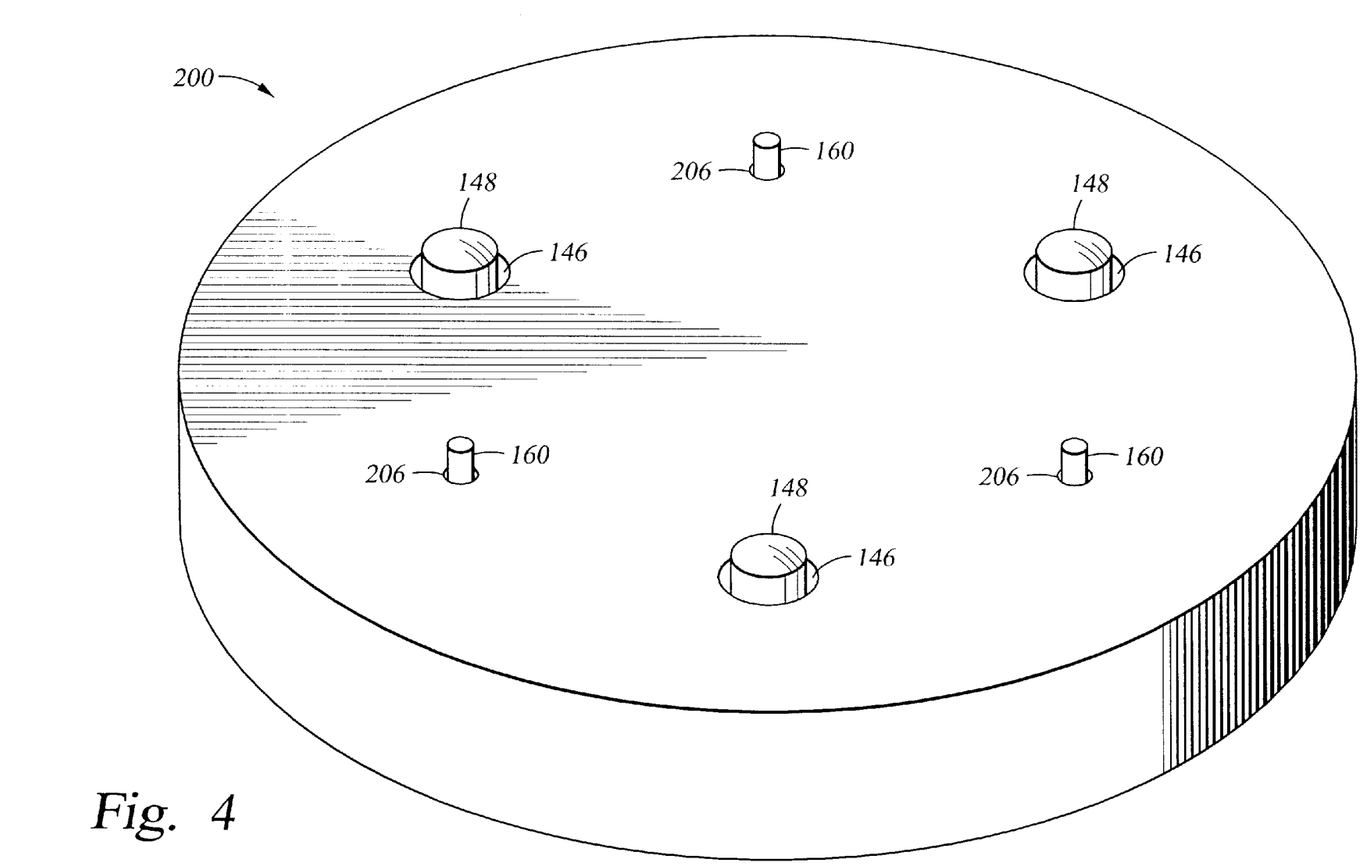
FIG. 4 is perspective view of a support member having three support pins of the invention disposed therein and three conventional lifting pins slidably coupled to three pin holes.

FIG. 4 is a perspective view of a support member 200 showing one embodiment of a support member having three support pins 148 disposed therein and three conventional lifting pins 160 slidably coupled through three pin holes 206. Preferably, three recesses 146 are equally spaced on the support member to house three support pins 148 which provide three point contact with the substrate to support the substrate in the chamber. The support member 200 also comprises three lift pins 160, independent from the support pins 148, each lift pin 160 being slidably coupled to the support member through a pin hole 206 in the support member. In this arrangement, the substrate has three contact points with the support member, one contact point with each support pin. The lift pins contact the substrate during placement or removal of the substrate in or from the chamber.

Figure 5:
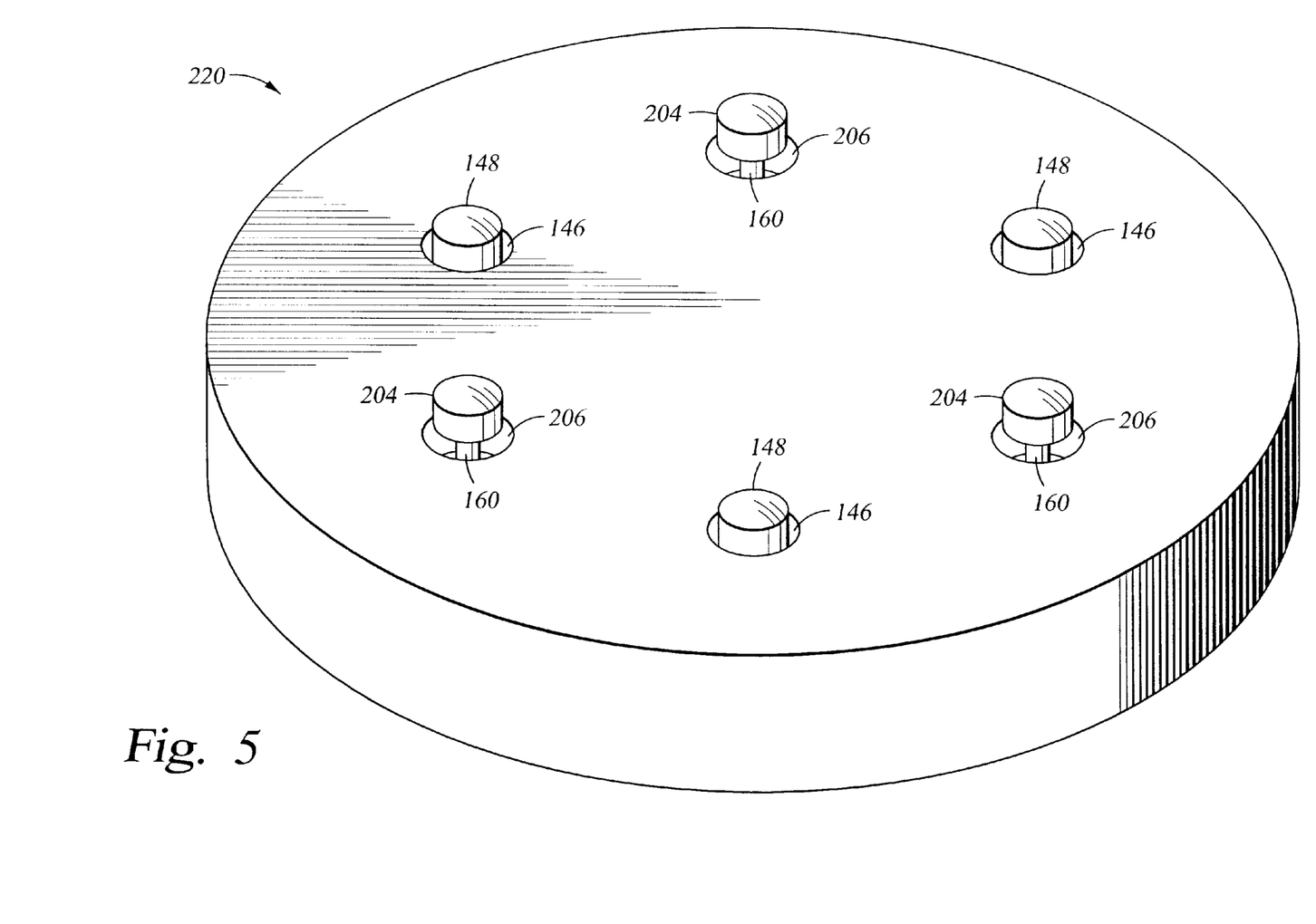
FIG. 5 is perspective view of a support member having three support pins of the invention disposed therein and three capped lifting pins of the invention slidably coupled to three pin holes.

Additionally, the lift pins may also mate with a capping portion, similar to the arcuate portion of the support pins, to minimize scratching near the area of contact between the lift pins and the backside of the substrate. FIG. 5 is a perspective view of a support member 220 having three support pins disposed therein and three caps 204 supported on lift pins 160. The caps may be recessed into the support member on retraction to allow the substrate to be supported on separate support pins for processing, alternatively, the caps may retract into recesses to serve as support pins. Each of these embodiments will be described below.

Figure 6:
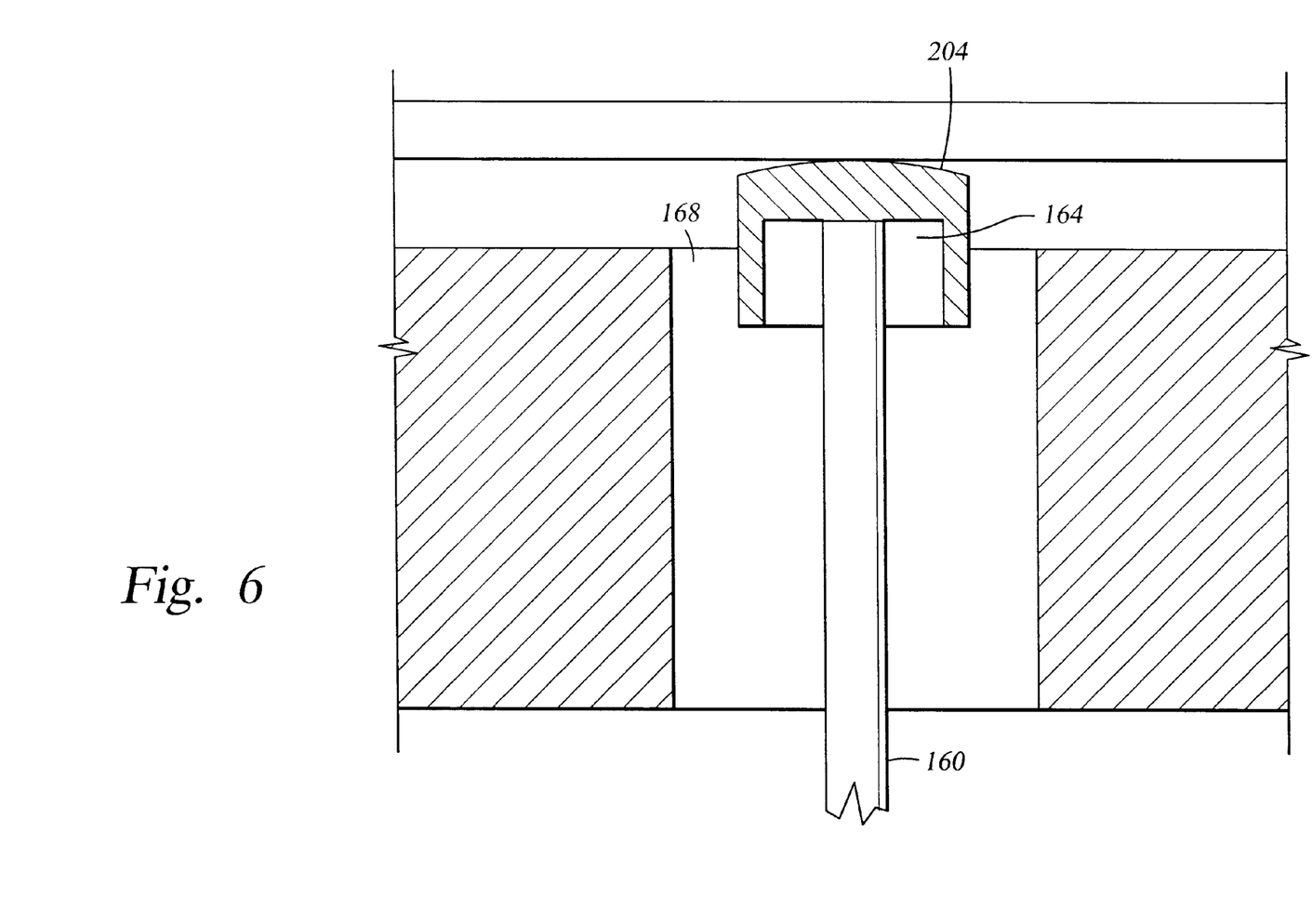
FIG. 6 is a partial sectional view of the substrate receiving region of a support member having retractable lift pins 160 with retractable caps 204.

FIG. 6 is a partial sectional view of the substrate receiving region of a support member having retractable lift pins 160 and retractable caps 204. The cap 204 is loosely coupled to lifting pin 160 to allow the substrate and the cap 204 to move in concert in response to vibrations that may occur in the system during substrate movement. Enlarging the recess 168 permits the retraction of the cap 204 along with the lift pin 160 allowing easier servicing and replacement of caps 204. When the caps 204 are retracted the substrate rests on independent support pins (not shown).

Figure 7:
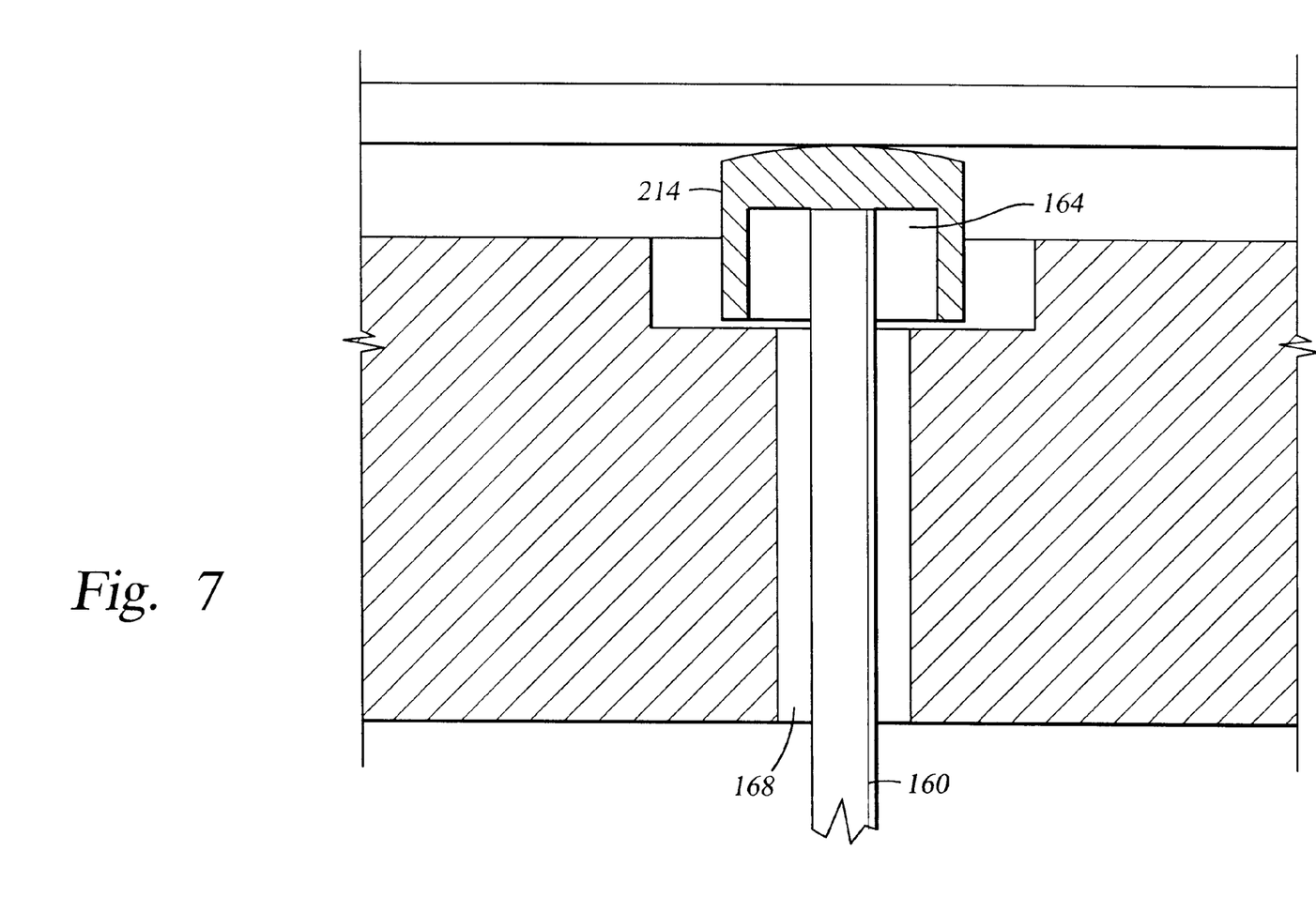
FIG. 7 is a partial sectional view of the substrate receiving region of a support member having a retractable lift pin 160 sidably coupled to a cap/support pin 214 disposed in the support member.

FIG. 7 is a partial sectional view of the substrate receiving region of a support member having a retractable lift pin 160 slidably coupled to a cap/support pin 214 disposed in the support member. In this embodiment, a recess 164 is formed in the cap/support pin 214 to receive a portion of lift pin 160. The lift pin 160 passes through a recess 168 formed in the bottom portion of the substrate receiving region of the support member. The dimensions of the recess 168 are smaller than the width of the cap/support pin 214 to allow retraction of the lift pin 160 from the recess 164 while keeping the cap/support pin 214 inside the recess 164. The dimension of the lift pin 160 and the cap/support pin 214 are adjusted to allow the cap and the substrate to move in concert in response to vibrations that may occur in the system during the lifting of the substrate. When the lift pin is retracted, the cap/support pin 214 remains in the recess 164 and serves as a support pin. The dimensions of the recess 164 are adjusted to allow the substrate and the cap/support pin 214, now serving as a support pin, to move in concert in response to vibrations that may occur in the system during substrate processing.

Figure 8:
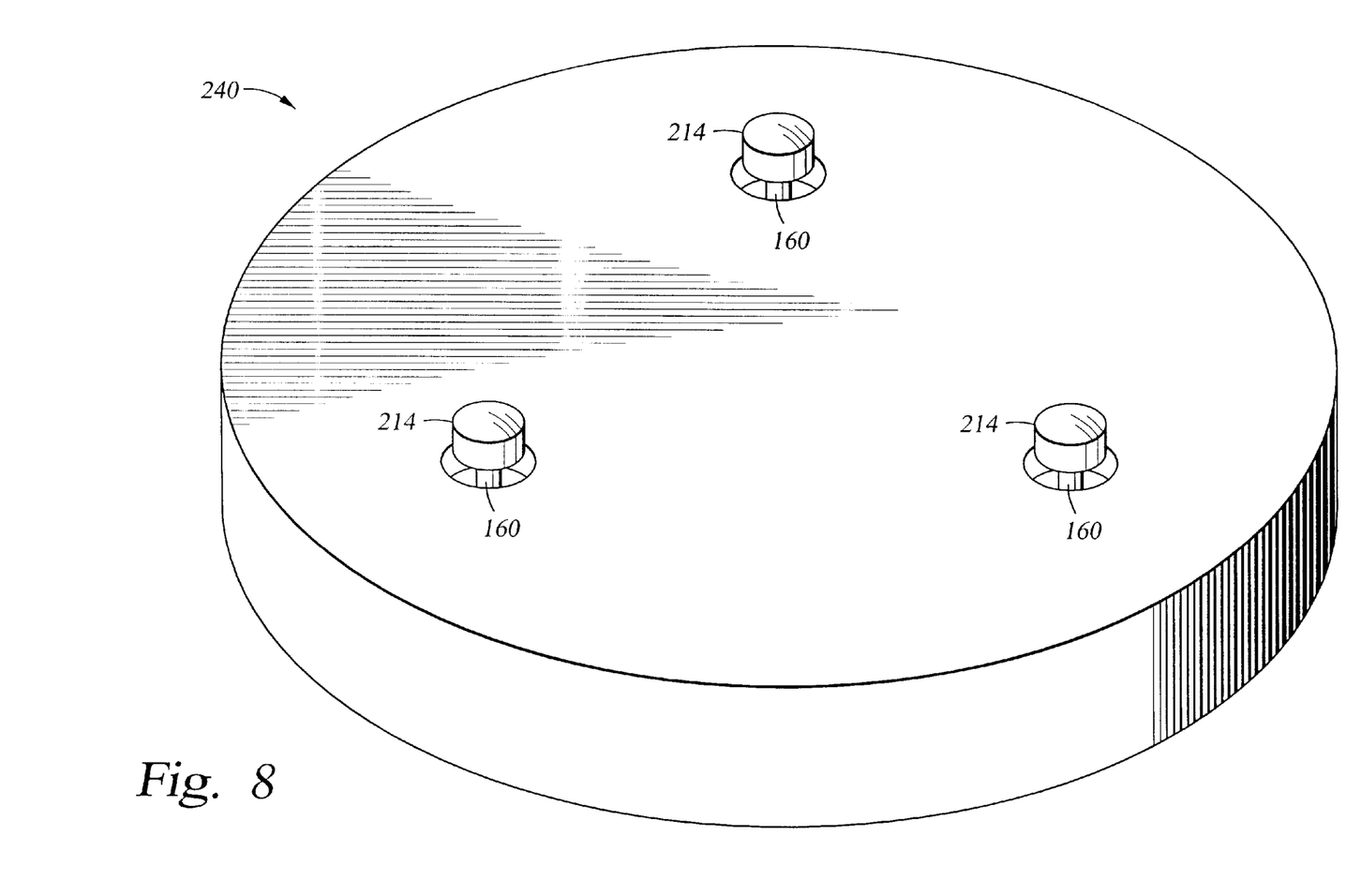
FIG. 8 is a perspective view of a support member 240 having three sets of lift/support pins.

FIG. 8 is a perspective view of a support member 240 having three sets of lift/support pins. Each set comprises a retractable lift pin 160 and a cap/support pin 214 as described in FIG. 7. Combining the lift pins 160 and the caps/support pins 214 reduces the area of the substrate contacted by the lifting and support components of the support member, thus reducing backside scratching that may occur when the substrate contacts the support member components.

Support member with optimized channel design to minimize backside deposition.

Figure 9:
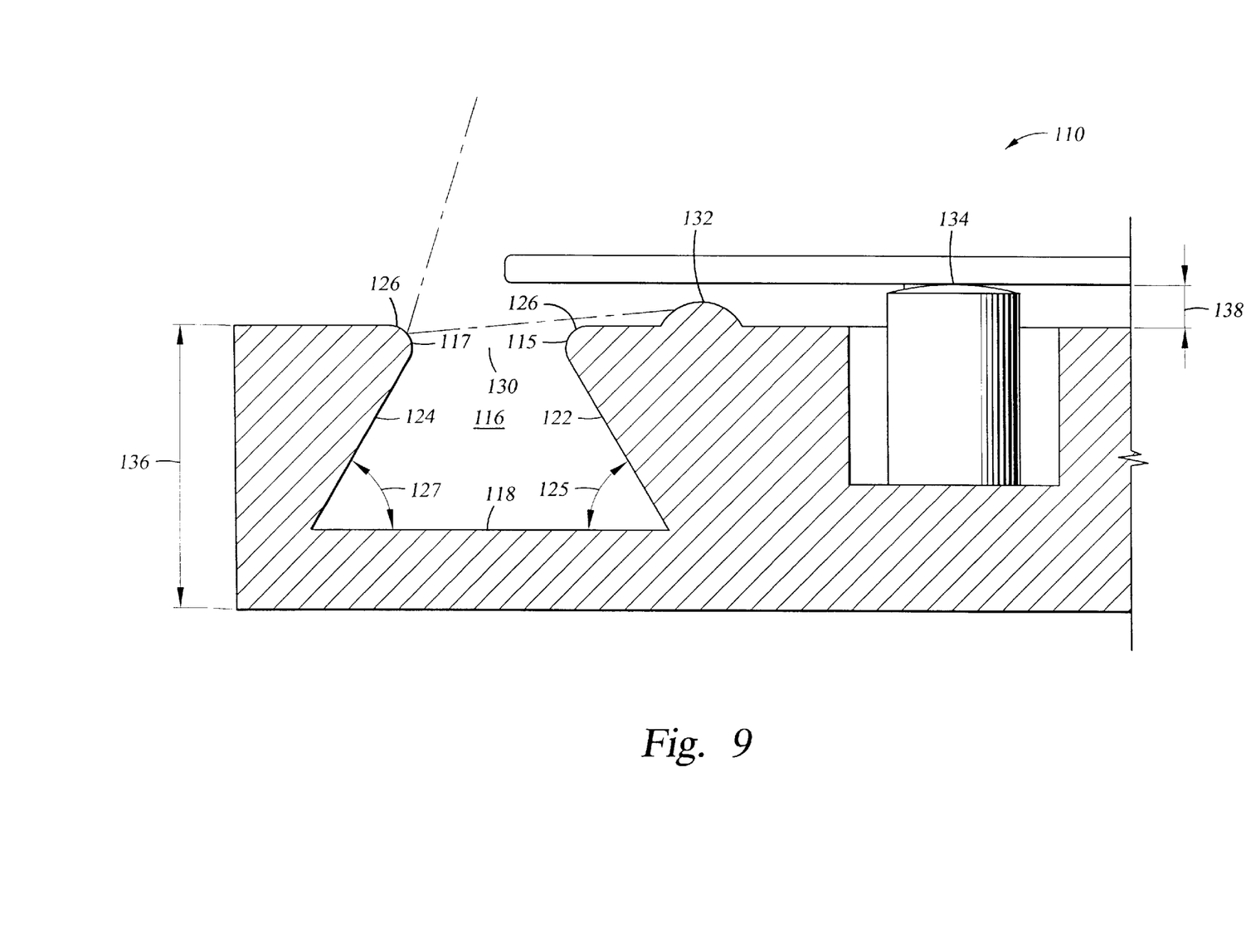
FIG. 9 is a partial sectional view of a support member having a quadrilateral perimeter channel optimized for material trapping, a supporting pin and a perimeter dam.

FIG. 9 is a partial sectional view of the peripheral portion of a substrate support member 110 having a channel 116 optimized for material trapping. The collection channel 116 is disposed around the perimeter of a substrate receiving surface and includes a base 118 and sidewalls 122, 124. The walls are slanted to form opposing acute angles 125, 127 with the base 118 and define a quadrilateral collection channel having a mouth 130 smaller than the base 118. The mouth of the quadrilateral collection channel is located so that the center of the channel is generally below the outer edges of the substrate.

When a particle enters the quadrilateral collection channel 116 through the mouth 130 it may have an initial impact with either one of the sidewalls or the base. If the particle has enough kinetic energy, it may continue its trajectory by bouncing between the sidewalls and the base until all the kinetic energy is dissipated, at which time the particle will accumulate with other particles already deposited in the channel. While a few particles may be able to escape from the quadrilateral collection channel through the mouth 130, it is expected that most particles entering the channel will be trapped by the angled sidewalls of the channel. The higher the ratio between the dimension of the base 118 and the mouth 130, the less likely it is for particles to escape from the channel. It should be noted however, that the dimensions of the mouth 130 should be optimized to allow a high number of particles to enter the channel while at the same time preventing them from escaping. Even when a particle escapes the channel, it will most likely do so along the central axis of the channel, thereby, preventing contact with the backside of the substrate.

Controlling the trajectories of particles impacting the walls of the channel to avoid contact between the particles and the backside of the substrate may further be achieved by rounding the top ends 126 of the sidewalls to form rounded corners 115, 117. In contrast to the chamfers described above, rounding the top ends of the walls of the channel minimizes the possibility that a particle will impact the top portion of the channel and continue on a trajectory directed toward the backside of the substrate. Most particles impacting the round corners 115, 117 will be deflected away from the backside of the substrate.

A dam 132 is disposed on the support member between the support pins and the perimeter of the substrate receiving surface to minimize backside deposition on the substrate and on the support pins thereby preventing adhesion of the substrate to the support member and/or the support pins. The dam is preferably disposed about the entire perimeter of the substrate receiving surface of the support member to provide a barrier to particles that may be directed into the space between the support member and the substrate. Particularly, the position and dimensions of the dam are optimized to prevent deposition material from reaching and accumulating near the area 134 where the backside of the substrate contacts the support pins.

Providing a dam to prevent material deposition near the area of contact between the substrate and the support pins, and trapping deposition material in the quadrilateral channel provided by the invention, results in a drastic reduction in the amount of material directed towards the backside of the substrate, thus significantly decreasing the possibility of formation of bridging layers between the substrate and the support member. The reduction of material deposition in the space between the substrate and the support member allows for reducing the gap between the substrate and the support member without promoting the formation of bridging layers. As shown in the design 110, increasing the thickness 136 of the support member while maintaining the substrate top surface at the same height, reduces the gap 138 between the support member and the backside of the substrate from 40 mils to 20 mils. Increasing the thickness 136 of the support member significantly enhances the capacity of the support member to better dissipate the heat generated during substrate processing in the chamber.

Figure 10:
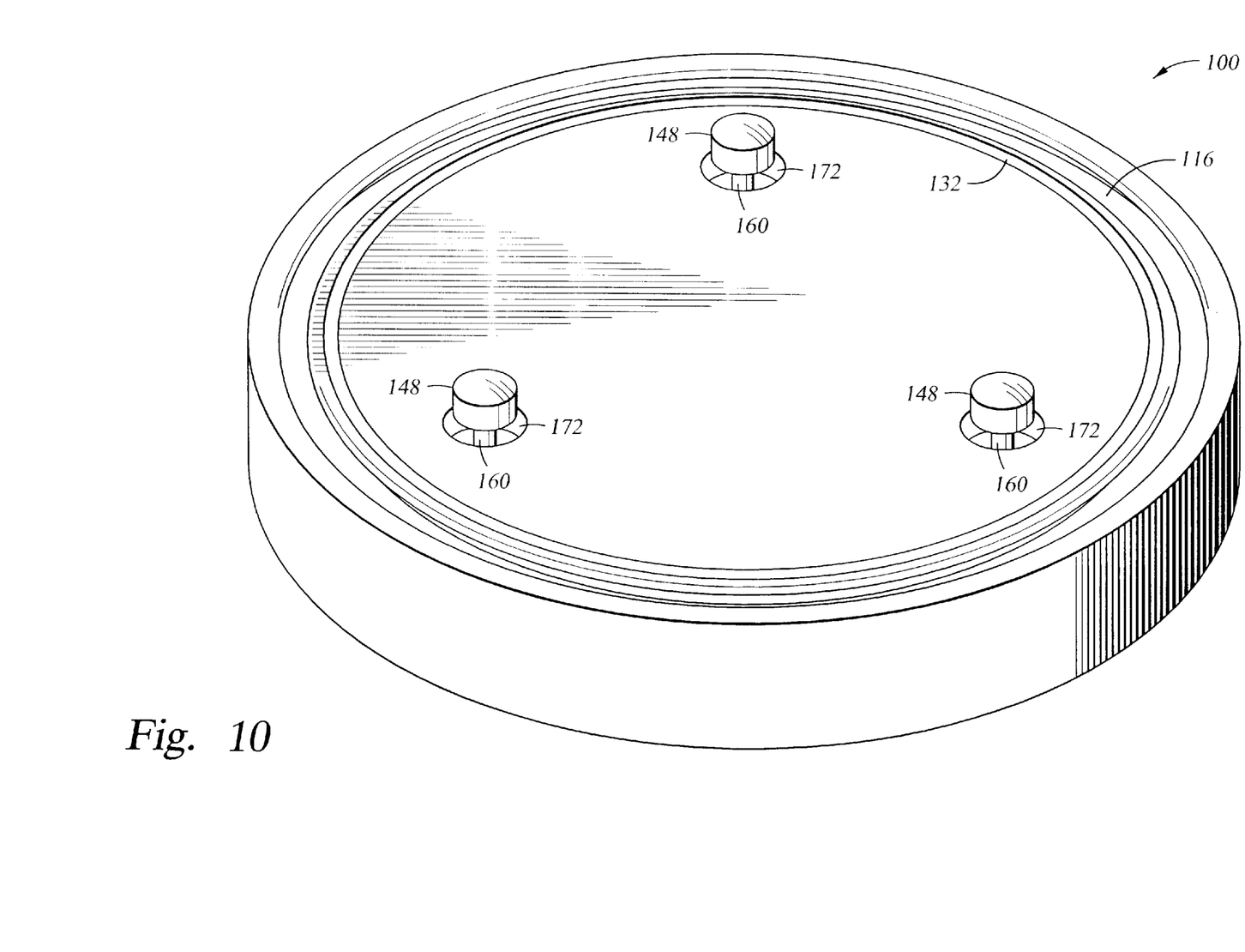
FIG. 10 is a perspective view of a substrate support member having three sets of retractable support and lift pins, a quadrilateral perimeter channel optimized for material trapping and a perimeter dam.

FIG. 10 is a perspective view of a support member 100 having a quadrilateral material trapping channel with rounded corners, a circular material deposition dam 132, and three pin holes 172. A set comprising a cap/support pin 148 and a lifting pin 160 is slidably coupled to each pin hole 172. The quadrilateral material trapping channel and the material deposition dam are concentrically positioned along the perimeter of the support member. The channel comprises slanted walls to prevent particles that enter the channel from bouncing out of the channel and depositing on the backside of the substrate. The upper corners of the channel are rounded to deflect material away from the backside of the substrate, particularly, the corners are designed to deflect particles away from the areas of the backside of the substrate contacting the caps/support pins. The dam 132 is positioned to interrupt the trajectory of particles that may be directed toward the area of the backside of the substrate near the support pin, thus, preventing the formation of a bridging layer between the substrate and the support pin. Resting the substrate on floating caps/support pins allows concurrent lateral movement of the substrate and the caps/support pins during movement of the substrate and/or the support member, thus, reducing the scratching of the backside of the substrate. Coupling the lift pins and the cap/support pins reduces the area of the substrate contacted by the components of the support member, thus decreasing the scratching associated with the friction between the resting and lift pins and the backside of the substrate.

While the foregoing is directed to the preferred embodiment of the present invention, other and further embodiments of the invention may be devised without departing from the basis scope thereof, and the scope thereof is determined by the claims that follow.

What is claimed is:

1. A processing chamber, comprising:
   an enclosure;
   a support member disposed in the enclosure for supporting a substrate in the chamber, a substrate receiving region and a peripheral region, the peripheral region located along a perimeter of the substrate receiving region; and
   a quadrilateral collection channel formed in the peripheral region of the support member, comprising a first wall adjacent the substrate receiving region, a second wall opposite the first wall, and a base defined at least partially by the first and second walls, wherein at least one of the walls is slanted to form an acute angle with the base.

2. The chamber of claim 1 wherein the quadrilateral collection channel has a trapezoidal shape.

3. The chamber of claim 2 wherein at least one wall has a rounded top end to form a mouth having at least one rounded lip.

4. The chamber of claim 2 wherein the first and second walls have rounded top ends to form a mouth having two rounded lips.

5. The chamber of claim 1 wherein the channel further comprises a mouth defined at least partially by the first and second walls.

6. The chamber of claim 5 wherein both walls are slanted to form opposite acute angles with the base.

7. The chamber of claim 1 wherein the support member comprises a dam positioned between the substrate receiving region and the peripheral region; the dam extending from a top end of the support member in a direction normal to the base of the channel.

8. A semiconductor substrate deposition chamber comprising:
   an enclosure;
   a support member positioned within the enclosure for supporting a substrate in the chamber, the support member having an upper and a lower portion and a first recess formed in the upper portion of the support member; and
   a support pin movably housed within the first recess.

9. The chamber of claim 8 wherein the support pin has an arcuate portion having a base and a height.

10. A semiconductor substrate deposition chamber, comprising:
    an enclosure;
    a support member positioned within the enclosure for supporting a substrate in the chamber, the support member having an upper and a lower portion, and a first recess formed in the upper portion of the support member; and
    a support pin housed within the first recess, wherein the support pin has an arcuate portion having a base and a height, and wherein the lower portion of the support member comprises a second recess in communication with a recess formed within the support pin having an opening opposite the arcuate portion of the support pin; the second recess having dimensions smaller than the width of the base.

11. A semiconductor substrate deposition chamber, comprising:
    an enclosure,
    a support member positioned within the enclosure for supporting a substrate in the chamber, the support member having an upper and a lower portion, and a first recess formed in the upper portion of the support member; and
    a support pin housed within the first recess, wherein the support pin has an arcuate portion having a base and a height, and wherein the lower portion of the support member comprises a second recess in communication with a recess formed within the support pin having an opening opposite the arcuate portion of the support pin; the second recess having dimensions smaller than the width of the base, and wherein the support member further comprises a lift pin slidably coupled to the recess in the support pin through the recess in the support member.

12. The chamber of claim 11 wherein the support member comprises top and bottom ends, a substrate receiving region and a peripheral region along a perimeter of the substrate receiving region; and
    a deposit collection channel formed in the peripheral region having a base formed in a bottom end of the support member and a mouth formed in a top end of the support member.

13. The chamber of claim 12 wherein the mouth has a width smaller than the width of the base of the channel.

14. The chamber of claim 12 wherein the channel comprises a first wall adjacent the substrate receiving region; and a second wall opposite the first wall; the walls having bottom ends separated by the base of the channel and top ends forming the mouth of the channel.

15. The chamber of claim 14 wherein at least one wall is slanted to form an acute angle with the base of the channel.

16. The chamber of claim 14 wherein both walls are slanted to form opposite acute angles with the base.

17. The chamber of claim 14 wherein at least one wall has a rounded top end to form a mouth having at least one rounded lip.

18. The chamber of claim 14 wherein the first and second walls have rounded top ends to form a mouth having two rounded lips.

19. The chamber of claim 12 wherein the support member comprises a dam positioned between the substrate receiving region and the peripheral region; the dam extending from the top end of the support member in a direction normal to the base of the channel.

20. The chamber of claim 12 wherein the support element has a thickness between 460 mils and 480 mils defined by the dimension perpendicular to the plane of the base of the channel.

21. The chamber of claim 12 comprising three support pins positioned in three cavities formed in the support member; the three support pins forming a triangle.

22. The chamber of claim 21 further comprising three lift pins, each lift pin slidably coupled to one support pin through a recess in the bottom portion of the support member.

23. The chamber of claim 21 further comprising three lift pins and three holes, each hole extending from the bottom end to the top end of the support member; and wherein each lift pin is slidably coupled to one hole.

24. The chamber of claim 23 wherein the support pins are coupled to the lift pins to form a triangle capable of lifting and resting the substrate.

25. A method of depositing material on a substrate in a processing chamber, the substrate having front and back sides, the method comprising:

(a) placing the substrate on a support member in the chamber;

(b) exposing the front side of the substrate to material originating from a sputtering target in the chamber;

(c) collecting at least a fraction of the material passing by the front side of a substrate deposition collection channel formed in the support member, the channel having a base and a mouth narrower than the base; and (d) reducing material deposition on the back side of the substrate.

26. The method of claim 25 wherein placing the substrate in the chamber:

(i) introducing the substrate through a slit in the chamber by a robot arm;

(ii) placing the substrate on support pins coupled to a support member;

(iii) releasing the substrate from the robot arm and retracting the arm from the chamber; and (iv) adjusting the distance between the substrate and the target by sliding lift pins coupled to the support pins in the support member.

27. The method of claim 26 wherein placing the substrate on support pins comprises reducing scratching of the backside of the substrate by placing the support pins in cavities formed within the support member and allowing the support pins to slide and rotate within the cavities.

28. The method of claim 26 wherein adjusting the distance between the substrate and the target comprises sliding a lift pin through a recess in the support member into a recess formed within a support pin.

29. The method of claim 25 further comprising providing a first wall adjacent the substrate receiving region; and a second wall opposite the first wall; the walls having bottom ends separated by the base of the channel and top ends forming the mouth of the channel.

30. The method of claim 29 further comprising slanting the walls to form opposing acute angles between the walls and the base of the channel.

31. The method of claim 29 further comprising rounding the top end of the walls to form a mouth having rounded lips.

32. The method of claim 25 wherein the support member further comprises a circular dam extending from the top end of the support member and concentric with the channel.

33. The method of claim 32 further comprising adjusting the position and the dimensions of the dam to minimize material deposition near the contact area between the backside of the support and the support pins.

* * * * *

UNITED STATES PATENT AND TRADEMARK OFFICE
CERTIFICATE OF CORRECTION

PATENT NO. : 6,146,504  
DATED : November 14, 2000  
INVENTOR(S) : Patadia et al.

Page 1 of 1

It is certified that error appears in the above-identified patent and that said Letters Patent is hereby corrected as shown below:

Title page,
Item [56] References Cited: FOREIGN PATENT DOCUMENTS, please insert "JP 2-80566 Abstract 3/1990".

Signed and Sealed this

Eighteenth Day of December, 2001

Attest:

JAMES E. ROGAN
*Attesting Officer*   *Director of the United States Patent and Trademark Office*